United States Patent
Sa

(10) Patent No.: US 8,766,190 B2
(45) Date of Patent: Jul. 1, 2014

(54) PIXEL, PIXEL ARRAY, IMAGE SENSOR INCLUDING THE SAME, METHOD FOR OPERATING THE IMAGE SENSOR

(75) Inventor: Seung Hoon Sa, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 447 days.

(21) Appl. No.: 13/240,099

(22) Filed: Sep. 22, 2011

(65) Prior Publication Data
US 2012/0326040 A1 Dec. 27, 2012

(30) Foreign Application Priority Data
Jun. 24, 2011 (KR) .................. 10-2011-0061631

(51) Int. Cl.
H01L 27/00 (2006.01)
H01L 27/14 (2006.01)
H01L 31/00 (2006.01)

(52) U.S. Cl.
USPC .................................. 250/338.4; 250/208.1

(58) Field of Classification Search
USPC .......................................... 250/338.4, 208.1
See application file for complete search history.

(56) References Cited

U.S. PATENT DOCUMENTS

| | | | |
|---|---|---|---|
| 7,154,157 B2 | 12/2006 | Bradski et al. | |
| 7,535,002 B2* | 5/2009 | Johnson et al. | 250/332 |
| 7,968,834 B2* | 6/2011 | Veeder | 250/208.1 |
| 2006/0114551 A1* | 6/2006 | Okada et al. | 359/350 |
| 2006/0124833 A1* | 6/2006 | Toda | 250/214 R |
| 2008/0068475 A1 | 3/2008 | Choe et al. | |
| 2009/0114961 A1* | 5/2009 | Ki | 257/292 |
| 2010/0020209 A1 | 1/2010 | Kim | |
| 2011/0013055 A1 | 1/2011 | Sul et al. | |

FOREIGN PATENT DOCUMENTS

| | | |
|---|---|---|
| KR | 10-0818987 B1 | 4/2008 |
| KR | 10-2010-0011676 A | 2/2010 |
| KR | 10-2011-0007408 A | 1/2011 |

OTHER PUBLICATIONS

Office Action dated Aug. 13, 2012 in Korean Application No. 10-2011-0061631, filed Jun. 24, 2011.
Notice of Allowance dated Aug. 19, 2013 in Korean Application No. 10-2011-0061631, filed Jun. 24, 2011.

* cited by examiner

*Primary Examiner* — David Porta
*Assistant Examiner* — Mindy Vu
(74) *Attorney, Agent, or Firm* — Saliwanchik, Lloyd & Eisenchenk

(57) ABSTRACT

Disclosed are a pixel, a pixel array, an image sensor including the same, and a method for operating the image sensor. Charges are eliminated from a first photoelectric conversion region of a photoelectric conversion section, and accumulated into the first photoelectric conversion region. Information about quantity of the charges of the first photoelectric conversion region is output, and charges are removed from a second photoelectric conversion region of the photoelectric conversion section. Accumulation of charges into the second photoelectric conversion region is started, and then information about quantity of the charges accumulated in the second photoelectric conversion region is output.

Lights having wavelength bands different from each other are independently detected according to disclosed invention.

17 Claims, 5 Drawing Sheets

(a)

(b)

PIXEL, PIXEL ARRAY, IMAGE SENSOR INCLUDING THE SAME, METHOD FOR OPERATING THE IMAGE SENSOR

CROSS-REFERENCE TO RELATED APPLICATION

This application claims the benefit under 35 U.S.C. §119 of Korean Patent Application No. 10-2011-0061631, filed on Jun. 24, 2011, which is hereby incorporated by reference in its entirety.

BACKGROUND

The embodiment relates to a pixel capable of individually distinguishing between visible and non-visible wavelength bands, a pixel array, an image sensor including the same, and a method for operating the image sensor. In particularly, the embodiment relates to a pixel capable of more simply distinguishing between lights having wavelength bands different from each other to detect the lights by additionally arranging a potential control switching section at one side of a photodiode.

Conventionally, an IR cut filter has been used in a camera module to filter lights having infrared wavelength bands, thereby sensing only lights in visible wavelength bands, so that image processing can be clearly performed. This is because it is difficult for an image sensor employing a silicon substrate to process mixed image signals obtained from both visible lights and infrared lights.

However, as a digital camcorder and a cellular phone have been popularized, infrared lights as well as visible lights must be exactly detected. Accordingly, an imaging apparatus equipped with an infrared image sensor together with a color image sensor has been increased. Hereinafter, the technologies of sensing infrared lights will be briefly described.

First, a predetermined layer may be inserted around an RGB color filter on a photodiode constituting an image sensor to transmit only wavelength bands of infrared lights. However, the technology of inserting the layer to transmit only the infrared lights may not be actually applied to a semiconductor device process.

Second, a scheme of distinguishing between visible and infrared image signals by performing an operation for mixed signals of the visible and infrared image signals after both visible lights and infrared lights are applied to one sensor. However, since an additional operation module for image processing of the mixed signals has a complex structure, the image processing of the mixed signals may be inconvenient.

BRIEF SUMMARY

The embodiment provides a pixel and a pixel array capable of detecting visible lights and infrared lights while distinguishing between the visible and infrared lights and independently processing the visible lights and the infrared lights as image signals.

According to one embodiment, there is provided a pixel including a photoelectric conversion section to detect a light on a substrate, a charge storage section to store charges obtained from the photoelectric conversion section on the substrate, a transfer switching section provided at one side of the photoelectric conversion section on the substrate to transfer the charges from the photoelectric conversion section to the charge storage section, a control switching section provided at an opposite side of the photoelectric conversion section on the substrate to control a photodetection range of the photoelectric conversion section according to an applied operating voltage, and an output section to output information about quantity of the charges stored in the charge storage section.

According to one embodiment, there is provided a method for operating an image sensor including removing charges from a first photoelectric conversion region of a photoelectric conversion section formed on a substrate, starting accumulation of charges into the first photoelectric conversion region, outputting information about quantity of the charges accumulated in the first photoelectric conversion region, removing charges from a second photoelectric conversion region of the photoelectric conversion section by driving a control switching section formed at one side of the photoelectric conversion section, starting accumulation of charges into the second photoelectric conversion region, and outputting information about quantity of the charges accumulated in the second photoelectric conversion region.

As described above, lights having different wavelength bands, such as infrared wavelengths bands and visible wavelength bands, can be independently and exactly detected and processed through a simple scheme without increasing the volume of an image sensor.

DETAILED DESCRIPTION

Figure 1:
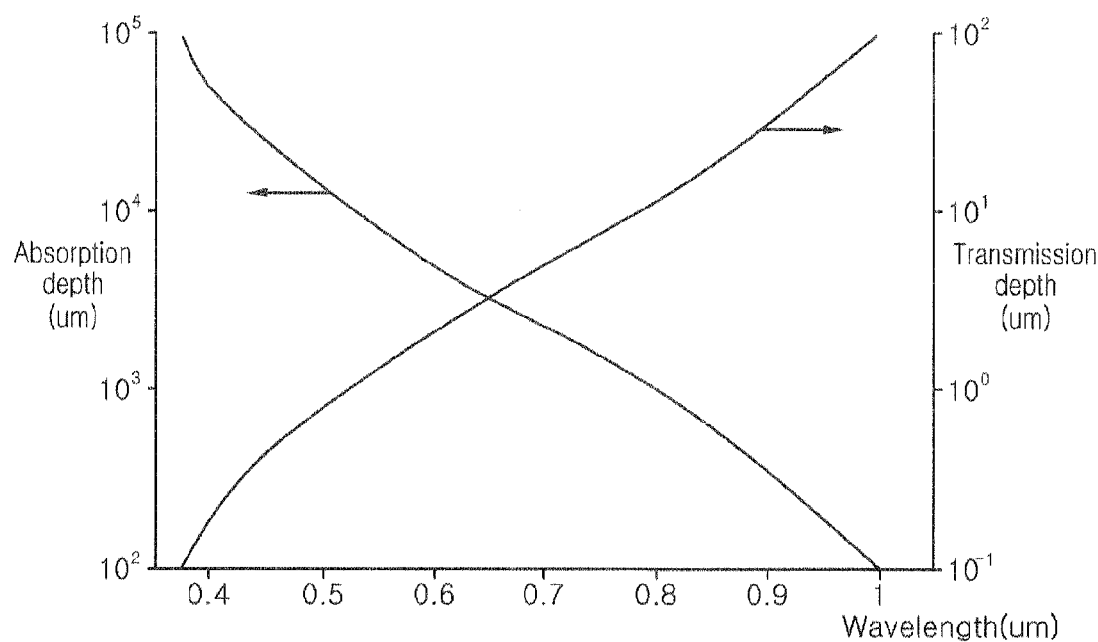
FIG. 1 is a graph showing the absorptance and the transmittance of a semiconductor substrate as a function of wavelengths of lights.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a graph showing the absorption depth and the transmission depth according to wavelengths in a semiconductor substrate. As shown in FIG. 1, the semiconductor substrate onto which a light is incident may be a silicon substrate used for an image sensor. Referring to FIG. 1, as the wavelength of the light is lengthened, an amount of the light absorbed in the semiconductor substrate is reduced. Accordingly, the light can be transmitted to the deeper region from the surface of the semiconductor substrate. Meanwhile, as the wavelength of the light is shortened, the light can be more absorbed into a semiconductor material, so that the transmission depth of the light is shortened. For example, a visible light or an ultra violet light having a shorter wavelength is absorbed near the substrate surface. However, the infrared light having the shorter wavelength can be absorbed to the deeper region from the substrate surface. If a doping region having a conductive type different from the conductive type is formed on the substrate by the difference in the light absorption into the substrate between wavelengths, the detection range of the light may vary according to the depths from the surface of the doping region.

Figure 2:
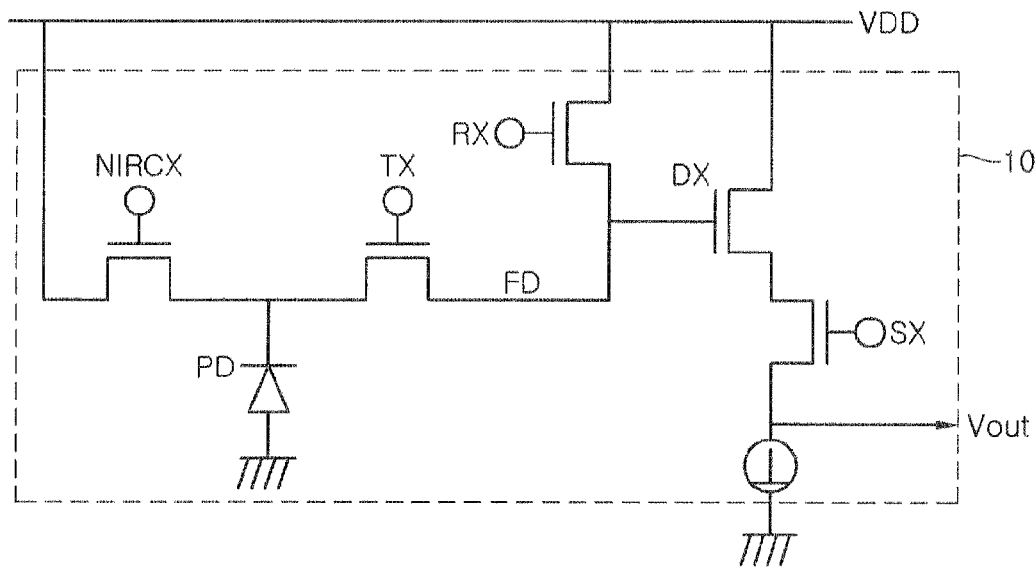
FIG. 2 is a circuit diagram showing a pixel array according to one embodiment.

FIG. 2 is a circuit diagram showing a pixel array 100 according to one embodiment. FIG. 2 shows the pixel array 100 including a unit pixel circuit 10 and a power supply VDD. The pixel array 100 according to the embodiment includes a circuit having the array structure of a plurality of pixels. FIG. 2 shows only the unit pixel circuit 10.

Referring to FIG. 2, the pixel array 100 according to the embodiment includes a photoelectric conversion section PD formed on the substrate to detect a light, a charge storage section FD provided at one side of the photoelectric conversion section PD on the substrate to store charges that has been converted in the photoelectric conversion section PD, a transfer switching section TX provided at one side of the photoelectric conversion section PD on the substrate to transfer charges from the photoelectric conversion section PD to the charge storage section FD, and a control switching section NIRCX provided at an opposite side of the photoelectric conversion section PD on the substrate to control the photodetection range of the photoelectric conversion section PD according to operating voltages applied to the control switching section NIRCX.

In addition, the pixel array 100 may include a reset switching section RX to remove charges from the charge storage section FD and an output section to output information about the quantity of charges stored in the charge storage section FD. The output section may include at least one of a drive switching section DX, a selection switching section SX, and an output voltage terminal Vout as shown in FIG. 2.

The switching sections TX, NIRCX, RX, DX, and SX shown in FIG. 2 may be made of CMOS transistors, and the charge storage section (Floating Diffusion Region) FD may be made of a capacitor. In addition, the pixel array 100 may further include a power supply VDD. If a plurality of pixel circuits are provided, the pixel circuits can share the power supply VDD together.

As shown in FIG. 2, according to the embodiment, the pixel array 100 may further include the control switching section NIRCS in addition to basic components and the 4T image sensors, so that the photoelectric conversion section PD of a pixel according to the embodiment can sense lights having both the visible wavelength hand and the non-visible wavelength band (NIR; Nrear Infrared), or only lights having the visible wavelength band.

The photoelectric conversion section PD, which is collects lights, converts the lights into charges, and accumulates the charges, includes a photodiode. The charges accumulated in the photoelectric conversion section PD may be transferred to the charge storage section FD according to operating voltages applied to the transfer switching section TX. The wavelength bands of lights detected by the photoelectric conversion section PD may vary according to the operating voltages applied to the control switching section NIRCX.

Meanwhile, the light detection range of the photoelectric conversion section PD described according to the embodiment may refer to the range of wavelengths of lights which are incident onto the pixel, absorbed by the photoelectric conversion section PD, and converted into charges to be output.

For example, even if lights having all wavelengths are incident onto the photoelectric conversion section PD and converted into charges, the absorption length of the lights vary according to wavelengths as shown in FIG. 1, and charges created at a predetermined deep region may not be transferred to the charge storage section FD, so that the charges may not be output.

In this case, if the operating voltage is applied to the control switching section NIRCX, the charges, which are created at the deeper region of the photoelectric conversion section PD, may be transferred to the charge storage section FD and output as compared with the case in which the operating voltage is not applied to the control switching section NIRCX. The charges created at the deeper region may be derived from lights having longer wavelengths, for example, lights belonging to an NIR band. Therefore, the control switching section NIRCX according to the embodiment can control the photodetection range of the photoelectric conversion section PD.

Details of the photoelectric conversion section PD will be described with reference to FIG. 3.

The control switching section NIRCX can control the photodetection range of the photoelectric conversion section PD according to operating voltages applied to the control switching section NIRCX. The control switching section NIRCX may operate in an on mode or an off mode according to the intensities of the operating voltages applied to the control switching section NIRCX. In the on mode in which a voltage greater than the operating voltage of the transfer switching section TX or the reset switching section RX operated by the power supply VDD is applied to the control switching section NIRCX, charges, which are created due to lights having long wavelengths, such as infrared lights, as well as charges created due to visible lights, can be transferred to the charge storage section FD from the photoelectric conversion section PD.

Meanwhile, in the off mode in which a voltage less than or equal to the operating voltage of the transfer switching section TX, for example, OV is applied to the control switching section NIRCX, the photoelectric conversion section PD can be operated in such a manner that only charges created due to lights, such as visible lights, having short wavelength bands can be transferred to the charge storage section FD.

Meanwhile, when the operating voltage is applied to the control switching section NIRCX, charges created due to the photoelectric conversion section PD may be transferred to the power supply VDD through the control switching section NIRCX (the refresh operation of an MR photodiode).

The charge storage section FD includes a capacitor having one end connected to the transfer switching section TX, and another end connected to the grounding voltage. In addition, the charge storage section FD may be reset by the reset switching section RX.

If a reset control signal is applied to the gate of the reset switching section RX, the reset switching section RX removes photocharges stored in the charge storage section FD in response to the reset control signal.

The drive switching section DX can transfer charges stored in the charge storage section FD to an output terminal Vout in response to the operation of the selection switching section SX. The drive switching section DX may be operated as an amplifier such as a source follower.

FIGS. 3A and 3B are sectional views showing the pixel array 100 according to one embodiment. Referring to FIGS. 3A and 3B, the pixel array 100 includes a photoelectric conversion section 18, the control switching section NIRCX, and the transfer switching section TX formed on a substrate 15.

Pixels may be separated from each other through an STI (Shallow Trench Isolation) process. FIG. 3A is a sectional view showing the off mode of the control switching section NIRCX, and FIG. 3B is a section view showing the on mode of the control switching section NIRCX.

The substrate 15 may include a silicon substrate doped with first conductive impurities such as P type impurities. The photodiode 18 may include a VIS photodiode 11 and an NIR photodiode 13. The VIS photodiode 11 may be a first photoelectric conversion region according to the embodiment, and the NIR photodiode 13 may be a second photoelectric conversion region according to the embodiment. The VIS photodiode 11 may be formed by a portion of the substrate 15 and a doping region doped with an N type impurity opposite to that of the substrate 15. Similarly to the VIS photodiode 11, the NIR photodiode 13 may be formed by a portion of the substrate 15 and a doping region doped with an N type impurity. The VIS and NIR photodiodes 11 and 13 are formed at different depths from the surface of the photoelectric conversion section 180. In the case of the off mode shown in FIG. 3A, the VIS and NIR photodiodes 11 and 13 are spaced apart from each other at a predetermined distance while interposing the substrate 15 therebetween. Since the formation position of the NIR photodiode 13 is farther away from the surface of the substrate 15 than the formation position of the VIS photodiode 11, the NIS photodiode 13 can convert the near infrared lights by absorbing a greater amount of Near infrared lights having long wavelength bands as compared with the VIS photodiode 11 absorbs the near infrared lights. In contrast, since the formation position of the VIS photodiode 13 is closer to the surface of the substrate 15 than the formation position of the NIR photodiode 11 is, the VIS photodiode 13 can convert visible lights into charges by converting a greater amount of visual lights having short wavelength bands. The ranges of lights detected by the NIR and VIS photodiodes 11 and 13 may not be individually separated from each other. For example, the infrared lights may be absorbed in even the VIS photodiode 13 as well as the NIR photodiode 11. In addition, a small amount of visible lights may be absorbed by the NIR photodiode 13.

The photoelectric conversion section 18 may include the VIS photodiode 11 and the NIR photodiode 13 distinguished from each other according to the photodetection ranges. The VIS and NIR photodiodes 11 and 13 have different photodetection ranges according to the depths at which the VIS and NIR photodiodes 11 and 13 are formed.

Figure 3:
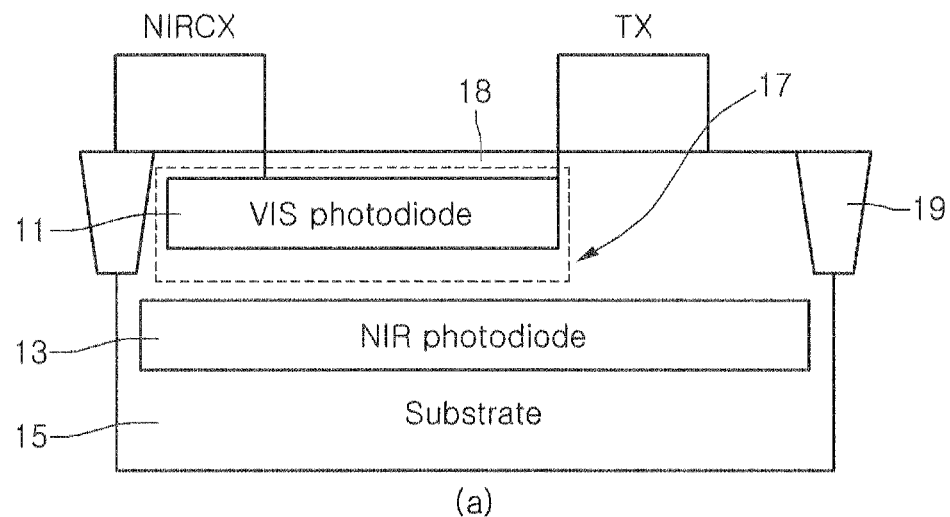
FIG. 3 is a sectional view showing the pixel array according to the embodiment.
Figure 3:
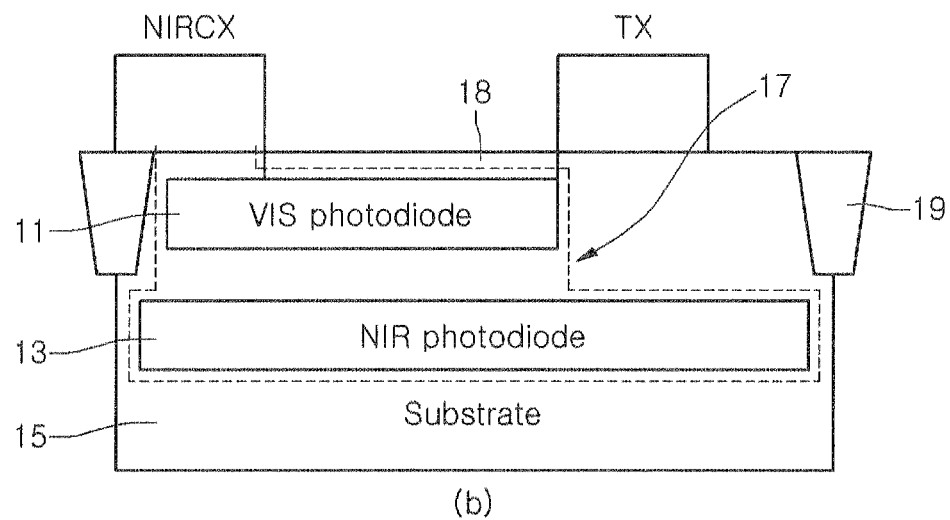

Meanwhile, although not shown in FIG. 3, an epitaxial layer may be formed on the substrate between doping regions 11 and 13.

Referring to FIG. 3A, in the off mode of the control switching section NIRCX, the operating voltage is applied to the transfer and reset switching sections TX and RX, so that the transfer and reset switching sections TX and RX may be refreshed. In this case, charges remaining in the VIS photodiode 11 are discharged through the power supply or the output terminal. Accordingly, a charge depletion region is formed in the VIS photodiode 11, and a boundary surface 17 of the charge depletion region is formed as shown in FIG. 3A. Since the charge depletion region is a boundary surface of a charge removal region, the boundary surface 17 may be the maximum potential line. As shown in FIG. 3A, when the control switching section NIRCX is in the off mode, the maximum potential line 17 of the VIS photodiode 11 is formed outside the NIR photodiode 13 while interposing the substrate 15 therebetween. After a refresh step, even if photocharges are started to be collected into the NIR photodiode 13, created photocharges cannot be transferred to the VIS photodiode 11. In addition, even if photocharges are accumulated in the NIR photodiode 13 through the incidence of the infrared lights, the photocharges are not output to the output terminal of the pixel.

Referring to FIG. 3B, when the control switching section NIRCX is in the on mode, the operating voltage is applied to the transfer switching section TX and the reset switching section RX so that a refresh operation may be performed. In this case, the maximum potential line 17 may be expanded to the NIR photodiode 13. In addition, the maximum potential line 17 may be expanded to the control switching section. NIRCX beyond the VIS photodiode 11. Therefore, charges accumulated in the VIS and NIR photodiodes 11 and 13 can be transferred to the power supply VDD connected to the control switching section NIRCX through the control switching section NIRCX. In other words, even charges formed in the NIR photodiode 13 can be removed.

Next, if the accumulation of the photocharges is commenced, the photocharges created by the NIR photodiode 13 due to the incidence of the infrared lights can be transferred to the VIS photodiode 11. In addition, if photocharges are accumulated in the NIR photodiode 13, the photocharges can be output through the output terminals of the pixel. Accordingly, if the control switching section NIRCX is in the on mode, not only charges created by the lights having short wavelength bands in the VIS photodiode, but also charges created by the lights having long wavelength bands in the NIR photodiode can be output through the output terminal.

Meanwhile, the voltage applied to the control switching section NIRCX may be greater than or less than the voltage supplied by the power supply VDD. For example, when the voltage supplied from the power supply VDD is in the range of about 2.8V to about 3.3V, the operating voltage of the control switching section NIRCX may be set in the range of about 3.5V to about 10V. When a voltage greater than the voltage supplied by the power supply VDD is applied to the control switching section NIRCX, the boundary surface 17 of the charge depletion region restricted in the off mode can be expanded to the NIR photodiode 13.

Further, in the on mode, the depth of the charge depletion region can be formed to the NIR photodiode 13, or to the region deeper than the NIR photodiode 13 by variously adjusting the range of the voltages applied to the control switching section NIRCX.

In other words, the range of lights detected when the control switching section NIRCX is in the off mode may be the first wavelength band of lights collected in the VIS photodiode 11. The range of lights detected when the control switching section NIRCX is in the on mode may be the second wavelength band of lights collected in the VIS photodiode 11 and the NIR photodiode 13. In other words, the range of the second wavelength band may include the first wavelength band.

Figure 4:
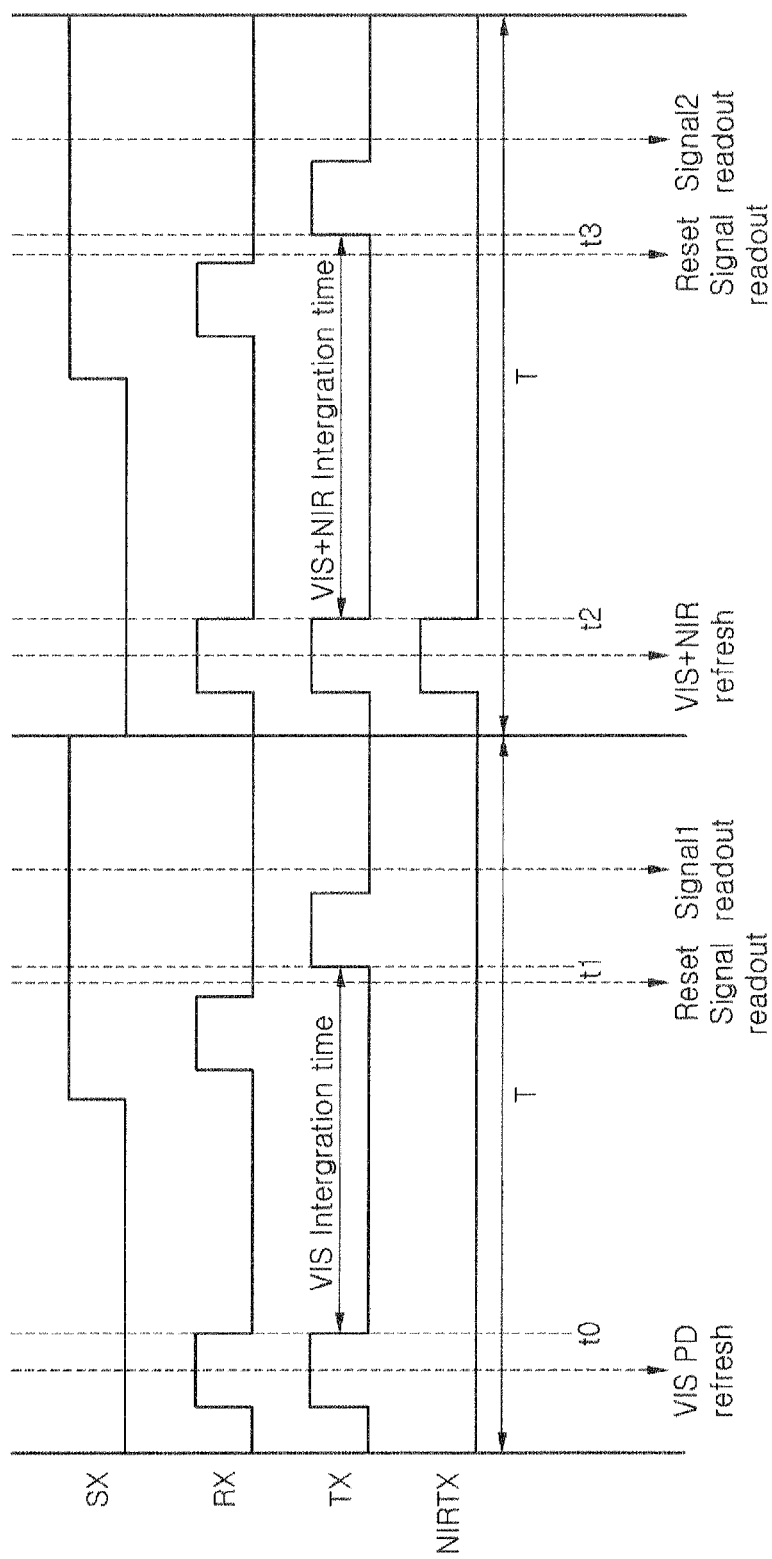
FIG. 4 is a timing diagram showing a method for operating an image sensor according to one embodiment.

FIG. 4 is a timing diagram showing a method for operating an image sensor according to one embodiment. As shown in FIG. 4, a light having the first wavelength band is detected for a first period T that the control switching section NIRCX is in the off mode, and a light having a second wavelength band is detected for a second period T that the control switching section NIRCX is in the on mode.

First, when the control switching section NIRCX is in the off mode, the reset switching section RX and the transfer switching section TX are turned on to refresh the VIS photodiode. The accumulation of photocharges of the VIS photodiode may be started at a time point t0 at which both the reset switching section RX and the transfer switching section TX are turned off. Thereafter, the reset switching section RX is turned on so that a reset signal is read out. At a time point t1, signals having the first wavelength band can be read by operating the transfer switching section TX. During the time interval between the time point t0 to the time point t1, charges are accumulated only in the VIS photodiode.

Next, in the on mode, the control switching section NIRCX turns on the reset switching section RX, the transfer switching section TX, and the control switching section NIRCX to refresh not only the VIS photodiode but also the NIR photodiode. The accumulation of photocharges in the VIS and NIR photodiodes may be commenced at a time point t2 at which the reset, transfer, and control switching sections RX, TX, and NIRCX are turned off. Thereafter, reset signals are read out by turning on the reset switching section RX, and the transfer switching section TX is turned on at a time point t3 so that the signals having the second wavelength band can be read. Charges are accumulated in the VIS and NIR photodiodes during the interval between the time point t2 to the time point t3.

As shown in FIG. 4, a light having a short wavelength band is read during one period of the pixel, and lights of the short and long wavelength bands are read during a next period, so that lights having the short and long wavelength hands are distinguishably detected through a proper operation. In FIG. 4, wavelength bands are alternately read by alternately driving the control switching section NIRCX in a unit of period. However, it is also possible to detect the light by operating the control switching section NIRCX in on or off mode during a ½ period.

Figure 5:
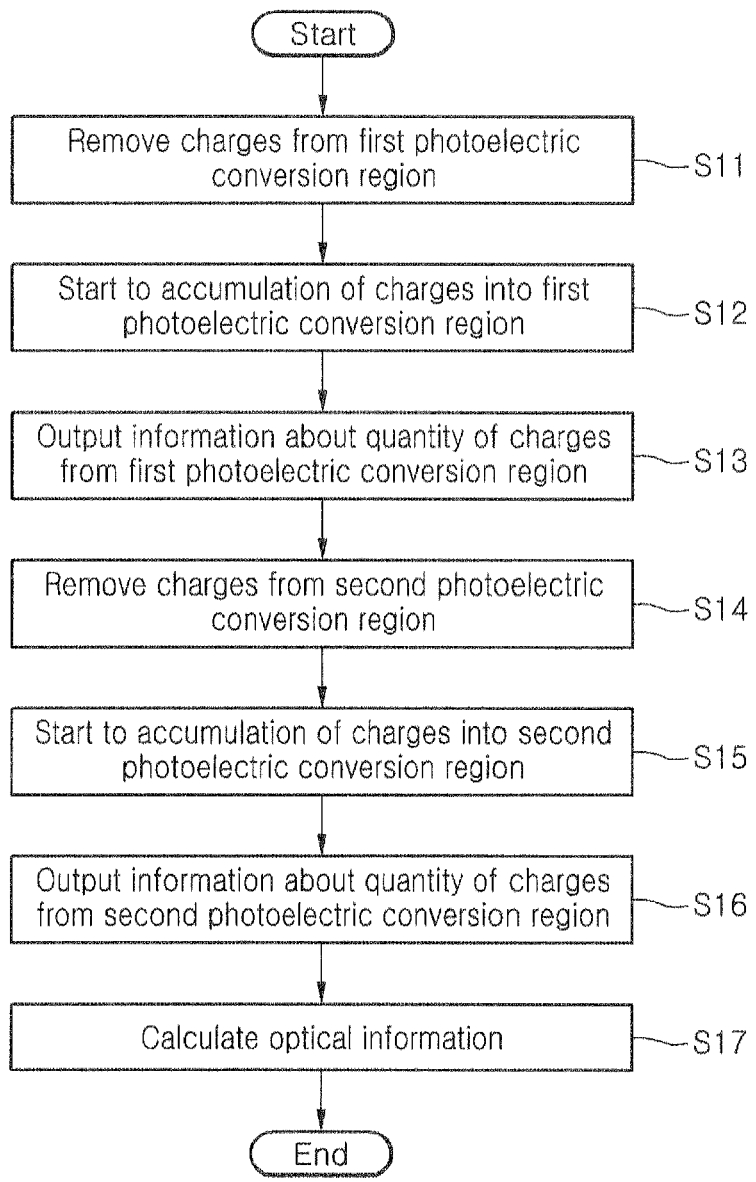
FIG. 5 is a flowchart showing the method for operating the image sensor according to the embodiment.

FIG. 5 is a flowchart showing the method for operating the image sensor according to one embodiment. The first photoelectric conversion region of FIG. 5 may include a VIS photodiode, and the second photoelectric conversion region may include an NIR photodiode.

In step S11, charges are removed from the first photoelectric conversion region. The charge removal from the first photoelectric conversion region may be performed by operating the reset switching section RX and the transfer switching section TX when the control switching section NIRCX is in the off mode.

In step S12, the charge accumulation procedure of the first photoelectric conversion region is started. The charge accumulation procedure may be started from a time point when the reset and transfer switching sections RX and TX are turned off after the reset and transfer switching sections RX and TX are turned on.

In step S13, information about the quantity of charges of the first photoelectric conversion region is output. The information about the quantity of the charges can be output when the transfer switching section TX is turned on after the accumulation of the photocharges in the first photoelectric conversion region has been commenced.

In step S14, the charges of the second photoelectric conversion region are removed. Simultaneously, the charges of the first photoelectric conversion region can be removed. The removal of the charges from the second photoelectric conversion region may be performed by turning on the reset switching section RX and the transfer switching section TX when the control switching section NIRCX is in the on mode.

In step S15, the charge accumulation procedure of the second photoelectric conversion region is commenced. The charge accumulation procedure may be commenced from the time point when the reset, transfer, and control switching sections RX, TX, and NIRCX are turned off after the reset and transfer switching sections RX and TX have been turned on by turning on the control switching section NIRCX. In this case, the charges in the first photoelectric conversion region can be accumulated.

In step S16, the information about the quantity of charges of the second photoelectric conversion region can be output. The information about the quantity of the charges can be output when the transfer switching section TX is turned on after the accumulation of the photocharges into the second photoelectric conversion region has been commenced. Simultaneously, the information about the quantity of charges of the first photoelectric conversion region can be output.

The information about the quantity of charges obtained in steps S17, S13, and S16 is calculated based on the photodetection range of the first and second photoelectric conversion regions, so that the information about lights can be calculated.

Figure 6:
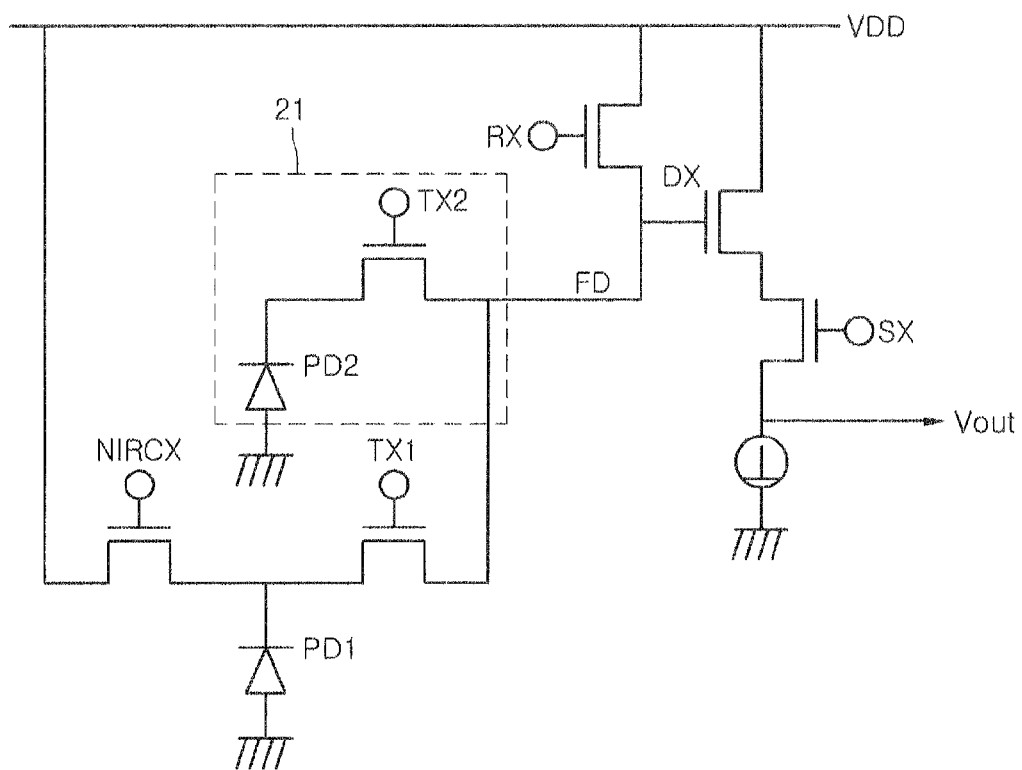
FIG. 6 is a circuit diagram showing a pixel array according to another embodiment.

FIG. 6 is a circuit diagram showing a pixel array 200 according to another embodiment. The pixel array 200 may include a first photoelectric conversion section PD1, the control switching section NIRCX, a first transfer switching section TX1, an VIS-ONLY-circuit 21 without the control switching section NIRCX, the reset switching section RX, the charge storage section FD, and output sections DX, SX, and Vout.

The pixel array 200 of FIG. 6 has the same structure as that of the pixel array 100 of FIG. 2 except for the VIS-ONLY-circuit 21.

The VIS-ONLY-circuit 21 includes a second photoelectric conversion section PD2 and a second transfer switching section TX2, and can detect and transfer only a light having the first wavelength band, for example, a visible light. In this case, the VIS-ONLY-circuit 21 detects only a light having the first wavelength band, and the first photoelectric conversion section PD1 including the control switching section NIRCX detects only a light having the second wavelength hand. Light detection operations of the first and third photoelectric conversion sections PD1 and PD2 may be performed at different timings. Accordingly, differently from the pixel array of FIG. 2 in which all lights having the first and second wavelength bands are detected through one photoelectric conversion section, the first and second wavelength hands are independently detected by two photoelectric conversion sections.

As described above, the embodiment can provide a pixel, a pixel array, an image sensor, and a method for operating the same capable of obviously processing visible lights and infrared lights.

Any reference in this specification to "one embodiment," "an embodiment." "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A pixel comprising:
    a photoelectric conversion section to detect a light on a substrate;
    a charge storage section to store charges obtained from the photoelectric conversion section on the substrate;
    a transfer switching section provided at one side of the photoelectric conversion section on the substrate to transfer the charges from the photoelectric conversion section to the charge storage section;
    a control switching section provided at an opposite side of the photoelectric conversion section on the substrate to control a photodetection range of the photoelectric conversion section according to an applied operating voltage; and
    an output section to output information about quantity of the charges stored in the charge storage section.

2. The pixel of claim 1, further comprising an operating section to calculate optical information by using the information about the quantity of the charges output from the output section based on the photodetection range.

3. The pixel of claim 1, wherein the photodetection range includes at least one of first and second wavelength bands, the first wavelength band includes a visible wavelength band, and the second wavelength band includes the visible wavelength band and an infrared wavelength band.

4. The pixel of claim 1, wherein the photoelectric conversion section includes first and second photoelectric conversion regions, which are doped with same conductive type impurities and have photodetection ranges, the second photoelectric conversion region is disposed deeper than the second photoelectric conversion region when measured from a surface of the photoelectric conversions section, and the second photoelectric conversion region detects a light having a wavelength band longer than a wavelength band of a light detected by the first photoelectric conversion region.

5. The pixel of claim 4, wherein the control switching section has an on operating mode and an off operating mode according to the applied operating voltage, the first and second photoelectric conversion regions are spaced apart from each other about the substrate in the off operating mode, and charges obtained from the second photoelectric conversion region are transferred to the first photoelectric conversion region in the on operating mode.

6. The pixel of claim 1, wherein the control switching section adjusts a depth of a charge depletion region of the photoelectric conversion section based on the operating voltage.

7. The pixel of claim 1, further comprising a power supply to supply operating power to the pixel, wherein an operating voltage of the control switching section is greater than or equal to the operating power of the power supply.

8. The pixel of claim 1, further comprising:
    a second photoelectric conversion section to detect a light on the substrate; and
    a second transfer switching section provided at one side of the second photoelectric conversion section on the substrate to transfer charges from the second photoelectric conversion section to the charge storage section,
    wherein a photodetection range of the second photoelectric conversion section belongs to the photodetection range of the photoelectric conversion section.

9. A pixel array comprising a plurality of pixels according to claim 1.

10. An image sensor comprising the pixel array claimed according to claim 9.

11. A method for operating an image sensor comprising:
    removing charges from a first photoelectric conversion region of a photoelectric conversion section formed on a substrate;
    starting accumulation of charges into the first photoelectric conversion region;
    outputting information about quantity of the charges accumulated in the first photoelectric conversion region;
    removing charges from a second photoelectric conversion region of the photoelectric conversion section by driving a control switching section formed at one side of the photoelectric conversion section;
    starting accumulation of charges into the second photoelectric conversion region; and
    outputting information about quantity of the charges accumulated in the second photoelectric conversion region.

12. The method of claim 11, further comprising calculating optical information by using the information about the quantity of the charges based on photodetection ranges of the first and second photoelectric conversion regions.

13. The method of claim 12, wherein the photodetection ranges include at least one of first and second wavelength bands, the first wavelength band includes a visible wavelength band, and the second wavelength band includes the visible wavelength band and an infrared wavelength band.

14. The method of claim 11, wherein the photoelectric conversion section includes the first and second photoelectric conversion regions, which are doped with same conductive type impurities and detect lights having wavelength bands different from each other, respectively, the second photoelectric conversion region is disposed deeper than the first photoelectric conversion region when measured from a surface of the photoelectric conversions section, and the second photoelectric conversion region detects the light having the wavelength band longer than the wavelength hand of the light detected by the first photoelectric conversion region.

15. The method of claim 11, wherein the control switching section has an on operating mode and an off operating mode according to an applied operating voltage, and the charges are removed from the second photoelectric conversion region in the on operating mode.

16. The method of claim 11, wherein the starting of accumulation of charges into the second photoelectric conversion region comprises expanding a depth of a charge depletion region of the photoelectric conversion section from the first photoelectric conversion region to the second photoelectric conversion region.

17. The method of claim 11, further comprising providing a power supply to supply operating power to the pixel, wherein an operating voltage of the control switching section is greater than or equal to the operating power of the power supply.

* * * * *